United States Patent [19]

Roychowdhury

[11] Patent Number: 5,844,821
[45] Date of Patent: Dec. 1, 1998

[54] SYSTEMS AND METHODS FOR DETERMINING CHARACTERISTICS OF A SINGULAR CIRCUIT

[75] Inventor: Jaijeet Roychowdhury, Murray Hill, N.J.

[73] Assignee: Lucent Technologies Inc., Murray Hill, N.J.

[21] Appl. No.: 841,298

[22] Filed: Apr. 29, 1997

[51] Int. Cl.[6] .............................. G06F 17/16; G06F 17/50
[52] U.S. Cl. ........................ 364/578; 364/488; 364/489; 364/490
[58] Field of Search ................................. 364/488, 489, 364/490, 491, 578; 395/500

[56] References Cited

U.S. PATENT DOCUMENTS

| 5,537,329 | 7/1996 | Feldmann et al. | 364/489 |
| 5,604,911 | 2/1997 | Ushiro | 395/800 |
| 5,666,367 | 9/1997 | Troyanovsky | 371/22.1 |

OTHER PUBLICATIONS

Diamantaras, K. et al., "Multilayer Neural Networks for Reduced Rank Approximation" IEEE Trans. on Neural Networks, pp. 684–697, Sep. 1994.

*Primary Examiner*—Vincent N. Trans
*Assistant Examiner*—A. S. Roberts

[57] ABSTRACT

Systems and methods for determining one or more characteristics of a singular circuit, allowing such circuits to be efficiently designed, tested and manufactured. One of the systems includes: (1) a minimum least-squares ("MLS") determination circuit that receives parameters relating to the singular circuit into a matrix A, determines range and null spaces for the matrix A, applies an orthonormalization procedure to determine a solution x to Ax=b', where b' is an orthogonal projection of a known vector b onto the range space of the matrix A and derives an MLS solution from the solution x and (2) a simulation circuit, coupled to the MLS determination circuit, that employs the MLS solution to simulate an operation of the singular circuit and determine the characteristic therefrom.

20 Claims, 2 Drawing Sheets

SYSTEMS AND METHODS FOR DETERMINING CHARACTERISTICS OF A SINGULAR CIRCUIT

TECHNICAL FIELD OF THE INVENTION

The present invention is directed, in general, to singular circuits and, more specifically, to systems and methods for determining the characteristics of an electronic circuit containing one or more singularities.

BACKGROUND OF THE INVENTION

A basic operation in circuit simulation, as in many other numerical computations, is that of solving a system of linear equations Ax=b for the vector x (with A a given sparse matrix and b a known vector) This operation arises, for example, in the Newton-Raphson method for nonlinear equation solution, as well as during the implicit integration of ordinary differential equations. In most practical situations, the matrix A is assumed to be of full rank or nonsingular, i.e., with a nonzero determinant. This assumption makes it possible to use efficient techniques, such as sparse LU factorization to obtain the solution x. The exploitation of sparsity is key to making large, practical problems computationally tractable.

In many real-life situations, however, the nonsingularity assumption for A does not hold. For example, a circuit consisting of two isolated parts (without a common ground), except for inductive coupling through a transformer, has a singular matrix. The reason for this is that one of the coils of the transformer floats with respect to the other. Despite the singularity, the circuit is meaningful because the designer is interested, not in the absolute potential, but in potential differences between nodes of interest. Singularity is also encountered in the DC analysis of circuits which have nodes with no path to ground not involving a capacitor. Such situations are especially common in circuits that rely on charge storage and transfer.

An important practical situation in which singular matrices occur is when real circuitry is macromodelled using idealized elements. This is common in the hierarchical design of systems, with some blocks represented in transistor-level detail and others as simple idealized macromodels. Often, the idealization is designed with a singularity—an example is a filter with a pole at zero frequency. In practical realizations, parasitics often remove exact singularities; even so, the matrix may be numerically singular owing to the finite precision to which numbers are represented in computers. Numerical singularities and near-singularities also occur in circuits with high-impedance nodes, such as inside high-gain operational amplifiers in open loop simulation.

Previous approaches towards solving singular circuits have all been based on modifying the circuit to remove its singularities. A common method to avoid floating node problems is to insert a small conductance gmin, usually across parasitic diodes in metal-oxide semiconductor ("MOS") and bipolar junction transistor ("BJT") devices. Checking the circuit's topology using graph-based rules is often used to detect structures that lead to matrix singularities; the designer is required to change the circuit to remove them before proceeding with the simulation. These techniques are not always effective, even for the subclass of singular circuits that they address. For example, small values of gmin can cause the Newton-Raphson method to take very large steps, leading to non-convergence. It is impossible to detect certain singularities by graph-based rules, for example in a tank circuit excited at its resonant frequency. Sometimes, the process of finding singularities can cause serious delays in design.

Therefore, what is needed in the art is a more efficient way of finding solutions to singular circuits and, with knowledge of such singularities, determining other characteristics of such singular circuits.

SUMMARY OF THE INVENTION

To address the above-discussed deficiencies of the prior art, the present invention provides systems and methods for determining one or more characteristics of a singular circuit. One of the systems includes: (1) a minimum least-squares ("MLS") determination circuit that receives parameters relating to the singular circuit into a matrix A, determines range and null spaces for the matrix A, applies an orthonormalization procedure to determine a solution x to Ax=b', where b' is an orthogonal projection of a known vector b onto the range space of the matrix A and derives an MLS solution from the solution x and (2) a simulation circuit, coupled to the MLS determination circuit, that employs the MLS solution to simulate an operation of the singular circuit and determine the characteristic therefrom.

The present invention therefore introduces the broad concept of addressing singularities at the matrix level, taking advantage of the fact that singularities are typically sparsely distributed in a given circuit. Prior art techniques, such as singular value or QR decomposition, destroy the sparsity of such singularities. It should be understood, however, that the present invention works with non-sparse singularity distributions, although requiring more iterations to reach the MLS solution.

In one embodiment of the present invention, the MLS determination circuit applies a factorization process to derive L and U factors for the matrix A. Those skilled in the art are familiar with LU factorization. The present invention can, however, operate with other known or later-discovered factorization techniques.

In one embodiment of the present invention, the matrix A is square. Although it need not be the case, most circuits are represented by a square matrix. In a related embodiment, a dimension of the range space equals matrix A's rank and a dimension of the null space equals matrix A's size minus matrix A's dimension.

In one embodiment of the present invention, the MLS determination circuit further determines a complement of the range space of the matrix A. The complement of the range space is advantageous over the range space itself for two reasons: (1) its dimension can be shown to be the same as the singularity of the singular circuit (and thus usually relatively small) and (2) it can be computed in a manner analogous to computing the null space.

In one embodiment of the present invention, the orthonormalization procedure is a Gram-Schmidt procedure. Those skilled in the art are familiar with Gram-Schmidt orthonormalization. However, the present invention may be used with other known or later-discovered orthonormalization procedures.

In one embodiment of the present invention, the simulation circuit employs the MLS solution iteratively to simulate the operation of the singular circuit. Iteration can be by means of a Newton-Raphson method or by other suitable means.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
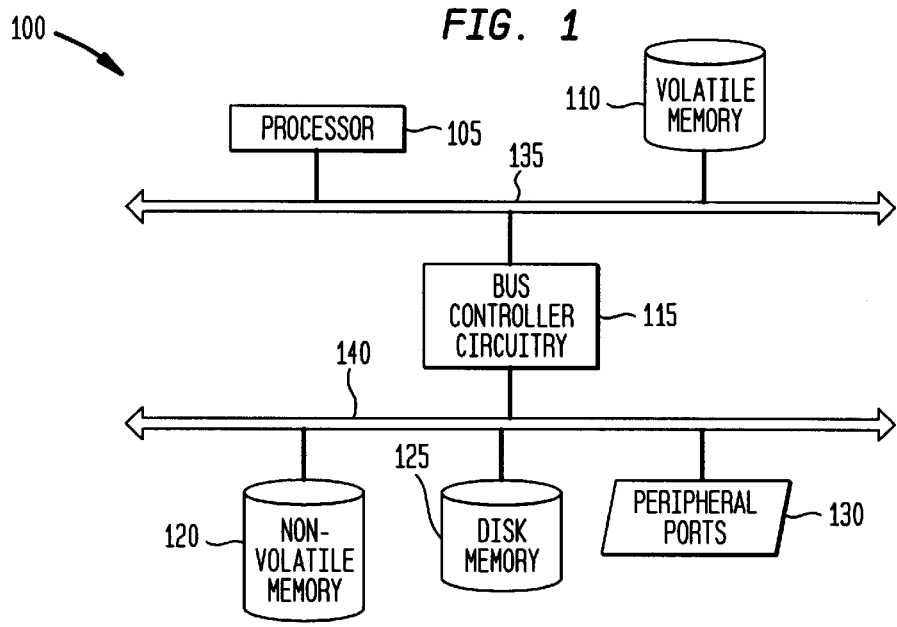
FIG. 1 illustrates a block diagram of an exemplary computer that may suitably provide an environment within which the present invention, in software form, may operate.

Referring initially to FIG. 1, illustrated is a block diagram of an exemplary computer 100 that may suitably provide an environment within which the present invention, in software form, may operate. The computer and the software cooperate to form a system for obtaining the "best" solution of a singular circuit. The present invention is not limited to application in a particular computing environment; thus, FIG. 1 is illustrative only. Alternate exemplary computers 100 may be personal, mini-, mainframe, super- or any other suitable stand-alone computers, as well as networks of computers, such as local area, and wide-area networks.

The exemplary computer 100 illustratively includes a processor 105, conventional volatile memory (e.g., random access memory) 110, bus controller circuitry 115, a conventional non-volatile memory (e.g., read-only memory) 120, a conventional video memory (e.g., video random access memory) 125 and a set of peripheral ports 130. An exemplary host bus 135 is shown and is suitably operative to associate the processor 105, the volatile memory 110 and the bus controller circuitry 115. An exemplary input/output ("I/O") bus 140 is shown and is operative to associate the bus controller circuitry 115, the non-volatile memory 120, the video memory 125 and the set of peripheral ports 130. The set of peripheral ports 130 may suitably couple the I/O bus 135 to any one or more of a plurality of conventional peripheral devices for communication therewith, such as communications circuitry for communicating with the Internet 115. Included among the set of peripheral ports 130 may be one or more serial or parallel ports.

The bus controller circuitry 115 provides suitable means by which the host bus 135 and the I/O bus 140 may be associated, thereby providing a path and management for communication therebetween. Each of the illustrated buses 135 and 140 requires a drive current to carry signals thereon. The illustrative circuit accordingly operates in conjunction with a conventional system controller (not shown) that supplies the required drive current.

In alternate advantageous embodiments, the processing circuitry associated with the exemplary computer 100 may, in whole or in part, be replaced by or combined with any suitable processing configuration, including parallel processors, programmable logic devices, such as programmable array logic ("PALs") and programmable logic arrays ("PLAs"), digital signal processors ("DSPs"), field programmable gate arrays ("FPGAs"), application specific integrated circuits ("ASICs"), large scale integrated circuits ("LSIs"), very large scale integrated circuits ("VLSIs") or the like, to form the various types of circuitry, controllers and systems described and claimed herein.

It should be noted that, while the computer 100 illustratively includes a dual-bus configuration, alternate embodiments may include single-bus or greater than two-bus configurations.

Again, the present invention attacks the problem of solving for singularities at the matrix level and is therefore uniformly applicable to any circuit situation that causes a singularity. As such, it does not require the explicit detection of the singularity, nor does the circuit need to be changed to remove the singularity. Information about the location of singularities is produced as a by-product of finding the "best" possible solution of the singular circuit. Unless the singularity is the result of an error in the circuit, the solution provided is what the designer is looking for.

The illustrated system operates on the following theory. Given a singular square matrix A and a vector b, the object in finding the "best" solution is solve for x satisfying the equation:

$$Ax=b \qquad (1)$$

If A is nonsingular, a unique x always satisfies Equation (1). If A is singular, however, two possibilities exist: if b is not in the range space of A (R(A)), no solution x exists satisfying Equation (1); if b is in the range space of A, a continuum of solutions x satisfies Equation (1).

Despite the lack of a unique solution in the singular case, it can be shown that an x* does exist that is the "best" solution to Equation (1), whether A is singular or not. x* is called the minimum least-squares ("MLS") solution and is defined to be the smallest possible vector (i.e., of smallest norm) that minimizes $\|Ax-b\|$. It is appropriate to think of x* as the best solution because of the following properties:

1. If A is nonsingular, x* is the unique solution of Equation (1).

2. If A is singular and b is in the range of A, then x* is the solution of minimum norm that satisfies Equation (1).

3. If A is singular and b is not in the range of A, then a unique vector b' exists in the range of A that is closest to b. x* is the solution of minimum norm satisfying Ax=b'.

Figure 2:
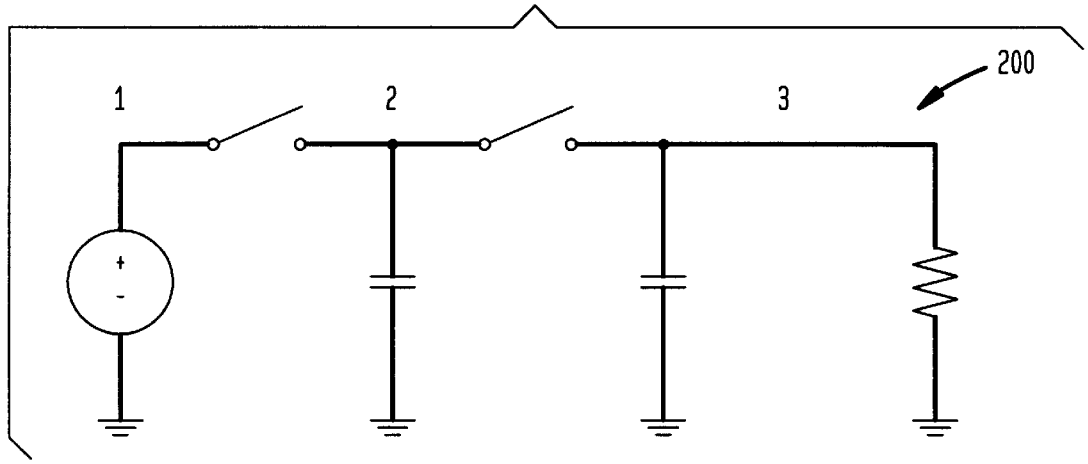
FIG. 2 illustrates an idealized representation of a switched-capacitor circuit.
Figure 3:
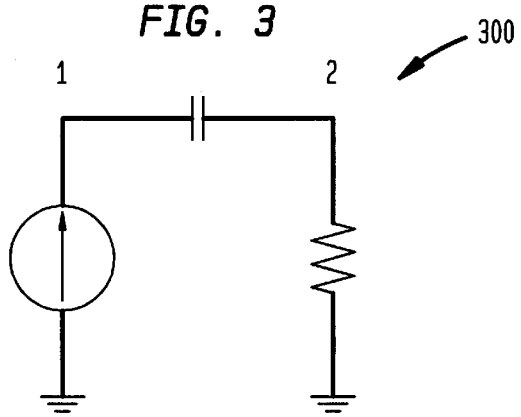
FIG. 3 illustrates an idealizes representation of a circuit segment generating a pole at zero frequency.

It is useful to obtain an appreciation of how properties 2 and 3 above relate to circuits. FIGS. 2 and 3 show two circuits: an idealized representation of a switched-capacitor circuit 200 and an idealizes representation of a circuit segment 300 generating a pole at zero frequency, respectively. Such structures are common in macromodels for system-level design. The circuit equations for the circuit 200 of FIG. 2 can be shown to be an example of property 2 above, i.e., b is in the range of A and the circuit has an infinite number of solutions. The MLS solution for this case corresponds to a voltage of zero at node 2. The circuit 300 of FIG. 3 is an example of property 3 above; it does not have any solution at DC. For this case, b' corresponds to setting the current source to zero; at this value, the circuit 300 has an continuum of solutions. The MLS solution corresponds to a voltage of zero at node 1.

The two examples illustrated in FIGS. 2 and 3 are simple linear ones. Most practical circuits are nonlinear. Hence, it is of interest to examine how the MLS solution generalizes to the nonlinear case. For an arbitrary nonlinear equation f(x)=0, the analog of the linear MLS solution is a minimum-norm x* that minimizes $\|f(x)\|$ locally. Unlike the linear case, several local minima may exist, leading to multiple values for x*, one for each local minimum of $\|f(x)\|$. An important connection between the linear and nonlinear cases is obtained through a generalization of the well-known Newton-Raphson method for solving nonlinear equations. The usual Newton-Raphson iteration is:

$$J\delta x = -f(x), \ J = \partial f/\partial x \quad (2)$$

If J is nonsingular, $\delta x$ is well-defined and unique. An immediate generalization when J is singular is to use the MLS solution of Equation (2) for $\delta x$. It can be shown that this variation maintains the local quadratic convergence properties of the Newton-Raphson method; the difference is that it converges to a local minimum of f(x), while the nonsingular Newton-Raphson converges to a zero of f(x). Hence, the linear MLS solution can be used in the Newton-Raphson method to obtain nonlinear, locally MLS solutions.

Let the size of A (the number of rows or columns) be denoted by n, which for practical circuits can easily be in the thousands. An important concept is the dimension of the null space N(A) of A. Denote this (also called the dimension of the singularity of A) by m. In circuit terms, m is the number of independent circuit segments that are not well-defined; for example, in FIGS. 2 and 3, m is 1. In practical circuits, m is usually much smaller than n and rarely exceeds 20 or 30. It will be seen below that this fact contributes to the efficiency of the present invention.

Traditional approaches for obtaining the MLS solution use singular value decomposition ("SVD") or QR decomposition of A, which destroy sparsity and are hence inefficient for large circuits. A property of the MLS solution that is sometimes used is the so-called normal equation:

$$A'Ax^* = A'b \quad (3)$$

If A is not square, but of full rank with more rows than columns, it can be shown that A'A is square and nonsingular. In such cases, the Equation (3) can be used with traditional nonsingular solution techniques to obtain the MLS. This situation is not however easily applicable to circuits, which typically have square matrices; moreover, forming A'A usually destroys sparsity to a considerable extent, reducing the effectiveness of sparse factorization techniques.

Figure 4:
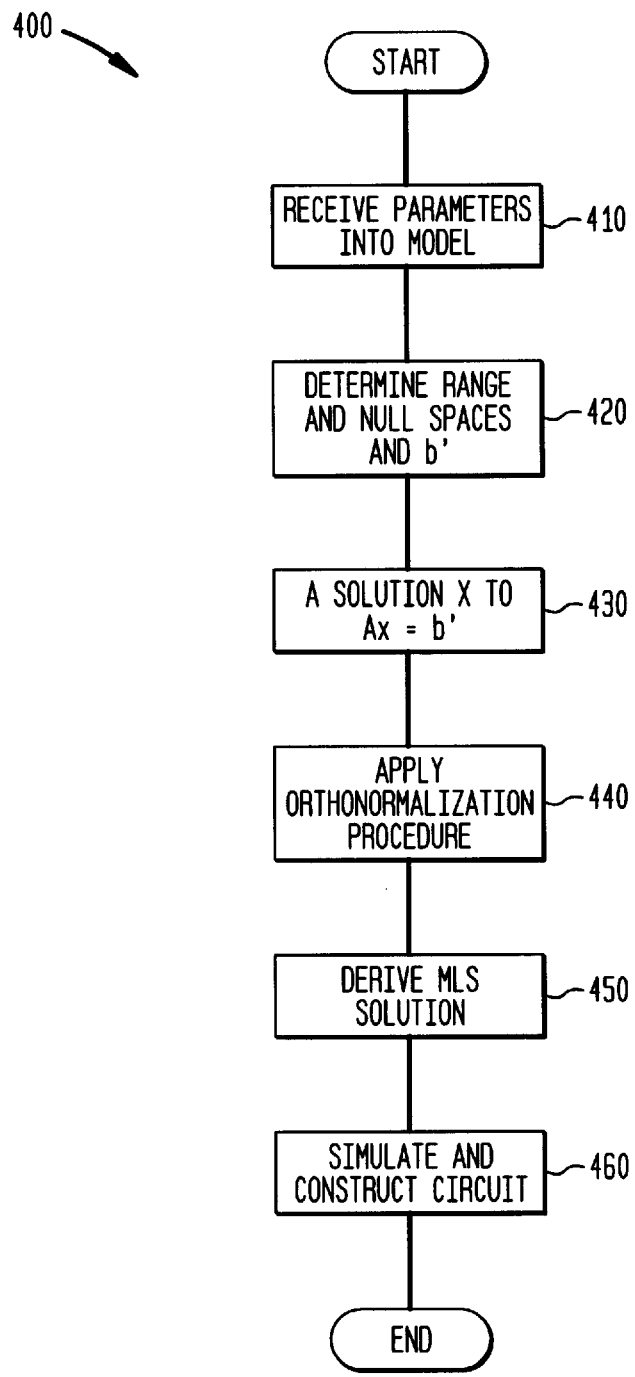
FIG. 4 illustrates a flow diagram setting forth an efficient method for obtaining the "best" solution of a singular circuit and for simulating and determining other characteristics of a singular circuit.

Turning now to FIG. 4, illustrated is a flow diagram, generally designated 400, setting forth an efficient method for obtaining the "best" solution of a singular circuit and for simulating and determining other characteristics of a singular circuit. Consider the most general property 3 above, with b∉R (A). The first step is to receive parameters pertaining to a given singular circuit into matrix A of the model of the present invention in a step 410. Next, range and null spaces for the matrix A and b', the orthogonal projection of b onto R(A), must be determined in a step 430; b' is the vector in R(A) that is closest to b, i.e., $\|b-b'\|$ is the minimum least-square error achievable.

Calculating b' is best achieved by first computing a basis for the orthogonal complement of the range space R(A) of A, rather than for R(A) itself. The orthogonal complement is preferable to the range space itself for two reasons:

1. Its dimension can be shown to be the same as m, hence the space is small, leading to computational efficiency.

2. Since the orthogonal complement of A is the same as the null space of A', it can be computed in the same manner as the basis for N(A) as described above, using A'=U'L'.

Once an orthonormal basis for the orthogonal complement is obtained, b' is derived by subtracting from b all its components in this space, analogous to the above equation.

The equation Ax=b' has a continuum of solutions, as illustrated in FIG. 2. If $x_1$ and $x_2$ are two such solutions, then $x_1-x_2$ is necessarily in the null space of A. Hence, to find the minimum normalized solution x*, one begins with any solution x of Ax=b' and subtracts from the solution all its components in the null space of A. In other words, x* is obtained from any solution x by subtracting from x its projection onto N(A).

To obtain numerical representations for the range space R(A), the null space N(A) and a solution x to Ax=b', LU factorization of A is used. Usually, LU factorization is performed only for nonsingular matrices; however, all square matrices, singular or otherwise, can be decomposed into LU factors. For concreteness, assume the Crout form of the LU algorithm, i.e., $L_{ii}=1, \forall_i \in \{1,\ldots,n\}$. This makes L always nonsingular; U can be shown to have the same rank as A. A difference between the singular and nonsingular cases is that, while U is unique if A is nonsingular, this is not so for singular A.

The LU factors of a singular matrix can be obtained by small modifications to the procedure for the nonsingular case, as follows: when singularity is detected by LU factorization, the remaining lower submatrices of L and U (of size m) are set to the identity and zero matrices of size m, respectively. Pivoting strategies and other heuristics used for nonsingular LU factorization carry over unchanged to this generalization.

Once the LU factors are available, they can be used to find N(A), R(A) and a solution to Ax=b'. First, consider the problem of finding any one solution $x^0$ of the consistent equation LUx=b', assuming b' has already been computed. Since L is nonsingular, we have Ux=$L^{-1}$b'. It can be shown the last m rows of U can be chosen to be identically zero without loss of generality if A is rank-deficient by m. Therefore, one solution is to set the last m variables of x to zero, and solve for the first n-m variables using normal reverse-substitution.

A slight variant of the above can be used to produce a basis for the null space N(A). To obtain m linearly independent vectors in N(A), the last m variables of x are chosen as follows: $\{1,0,\ldots,0\}, \{0,1,0,\ldots,0\}, \ldots, \{0,0,\ldots,1\}$. With each of these choices, Ux=0 is solved for the top n-m remaining variables using back-substitution. The resulting vectors form a basis for N(A) and are linearly independent. Let the basis be denoted by $\{n^1,\ldots,n^{\hat{}}m\}$.

The projection of $x^0$ onto N(A) is obtained next. For this task, it does not suffice to have a basis that spans N(A); it is necessary to obtain an orthonormal basis. Given the basis $\{n^1,\ldots,n^m\}$, a standard Gram-Schmidt orthonormalization procedure is used in a step 440 to convert $x^0$ into an orthonormal basis. Let the orthonormal basis thus obtained be denoted by $\{n^{o1},\ldots,n^{om}\}$.

Once the orthonormal basis is available, the MLS solution x* is easily obtained from $x^0$ by subtracting the projection:

$$x^* = x^0 - \sum_{I=1}^{m} <x^0, n^{oi}> n^{oi} \quad (4)$$

where (•,•) denotes the dot product. Equation (4) eliminates any component of N(A) from $x^0$, leaving the MLS solution (a step 450).

The LU factorization and Gram-Schmidt orthonormalization steps (the steps 430, 440) involved in the above procedure dominate the computation. LU factorization is almost linear in the size of the matrix n when A is sparse. The Gram-Schmidt procedure requires $O(nm^2)$ operations, i.e., it is linear in n and quadratic in m. For this reason, the method is best suited for small m, a situation that holds for most circuit applications.

Next, the singular circuit may be further simulated in a step 460 and, upon removal of undesired singularities, the circuit may then be actually constructed and mass-produced in a step 460.

The method of the present invention is relevant to a number of other areas as well those discussed above. Radio frequency ("RF") circuits and harmonic balance, analysis of tank circuits and oscillators, transient analysis, optimization, homotopy methods, solutions using charge conservation and AHDL simulation are examples.

Although the present invention and its advantages have been described in detail, those skilled in the art should understand that they can make various changes, substitutions and alterations herein without departing from the spirit and scope of the invention in its broadest form.

What is claimed is:

1. A system for determining a characteristic of a singular circuit, comprising:
    a minimum least-squares (MLS) determination circuit that receives parameters relating to said singular circuit into a matrix A, determines range and null spaces for said matrix A, applies an orthonormalization procedure to determine a solution x to Ax=b', where b' is an orthogonal projection of a known vector b onto said range space of said matrix A and derives an MLS solution from said solution x; and
    a simulation circuit, coupled to said MLS determination circuit, that employs said MLS solution to simulate an operation of said singular circuit and determine said characteristic therefrom.

2. The system as recited in claim 1 wherein said MLS determination circuit applies a factorization process to derive L and U factors for said matrix A.

3. The system as recited in claim 1 wherein said matrix A is square.

4. The system as recited in claim 1 wherein a dimension of said range space equals a rank of said matrix A and a dimension of said null space equals a size of said matrix A minus said dimension of said matrix A.

5. The system as recited in claim 1 wherein said MLS determination circuit further determines a complement of said range space of said matrix A.

6. The system as recited in claim 1 wherein said orthonormalization procedure is a Gram-Schmidt procedure.

7. The system as recited in claim 1 wherein said simulation circuit employs said MLS solution iteratively to simulate said operation of said singular circuit.

8. A method of manufacturing a circuit, comprising the steps of:
    receiving parameters relating to a singular circuit into a matrix A;
    determining range and null spaces for said matrix A;
    applying an orthonormalization procedure to determine a solution x to Ax=b', where b' is an orthogonal projection of a known vector b onto said range space of said matrix A;
    deriving an MLS solution from said solution x;
    employing said MLS solution to remove undesired singularities from said singular circuit; and
    constructing said circuit.

9. The method as recited in claim 8 wherein said step of determining comprises the step of applying a factorization process to derive L and U factors for said matrix A.

10. The method as recited in claim 8 wherein said matrix A is square.

11. The method as recited in claim 8 wherein a dimension of said range space equals a rank of said matrix A and a dimension of said null space equals a size of said matrix A minus a dimension of said matrix A.

12. The method as recited in claim 8 further comprising the step of determining a complement of said range space of said matrix A.

13. The method as recited in claim 8 wherein said orthonormalization procedure is a Gram-Schmidt procedure.

14. A system for determining a characteristic of a singular circuit, comprising:
    a minimum least-squares (MLS) determiner that receives parameters relating to said singular circuit into a matrix A, applies an LU factorization procedure to determine range, range-complement and null spaces for said matrix A, applies an orthonormalization procedure to determine a solution x to Ax=b', where b' is an orthogonal projection of a known vector b onto said range space of said matrix A and derives an MLS solution from said solution x; and
    a simulator, coupled to said MLS determiner, that employs said MLS solution iteratively to simulate an operation of said singular circuit and determine said characteristic therefrom.

15. The system as recited in claim 14 wherein said matrix A is square.

16. The system as recited in claim 14 wherein a dimension of said range space equals a rank of said matrix A and a dimension of said null space equals a size of said matrix A minus a dimension of said matrix A.

17. The system as recited in claim 14 wherein said orthonormalization procedure is a Gram-Schmidt procedure.

18. The system as recited in claim 14 wherein said MLS determiner is embodied as a sequence of software instructions executable in logic circuitry.

19. The system as recited in claim 14 wherein singularities are distributed sparsely in said singular circuit.

20. The system as recited in claim 14 wherein said singular circuit is a very large scale integrated (VLSI) circuit.

* * * * *